July 6, 1965 E. BURSTEIN 3,193,685

PHOTOSENSITIVE SUPERCONDUCTOR DEVICE

Filed Dec. 1, 1961 3 Sheets-Sheet 1

INVENTOR
ELIAS BURSTEIN

BY

W.S. Hill
AGENT

INVENTOR.
ELIAS BURSTEIN
BY
W. S. Hill
AGENT

July 6, 1965 E. BURSTEIN 3,193,685

PHOTOSENSITIVE SUPERCONDUCTOR DEVICE

Filed Dec. 1, 1961

3 Sheets-Sheet 3

INVENTOR.
ELIAS BURSTEIN
BY
W. S. Hill
AGENT

United States Patent Office 3,193,685
Patented July 6, 1965

3,193,685
PHOTOSENSITIVE SUPERCONDUCTOR DEVICE

Elias Burstein, Narberth, Pa., assignor to Radio Corporation of America, a corporation of Delaware Filed Dec. 1, 1961, Ser. No. 157,181
6 Claims. (Cl. 250—211)

Figures 1A, 1B, 1C, 1D, 2A, 2B, 2C:
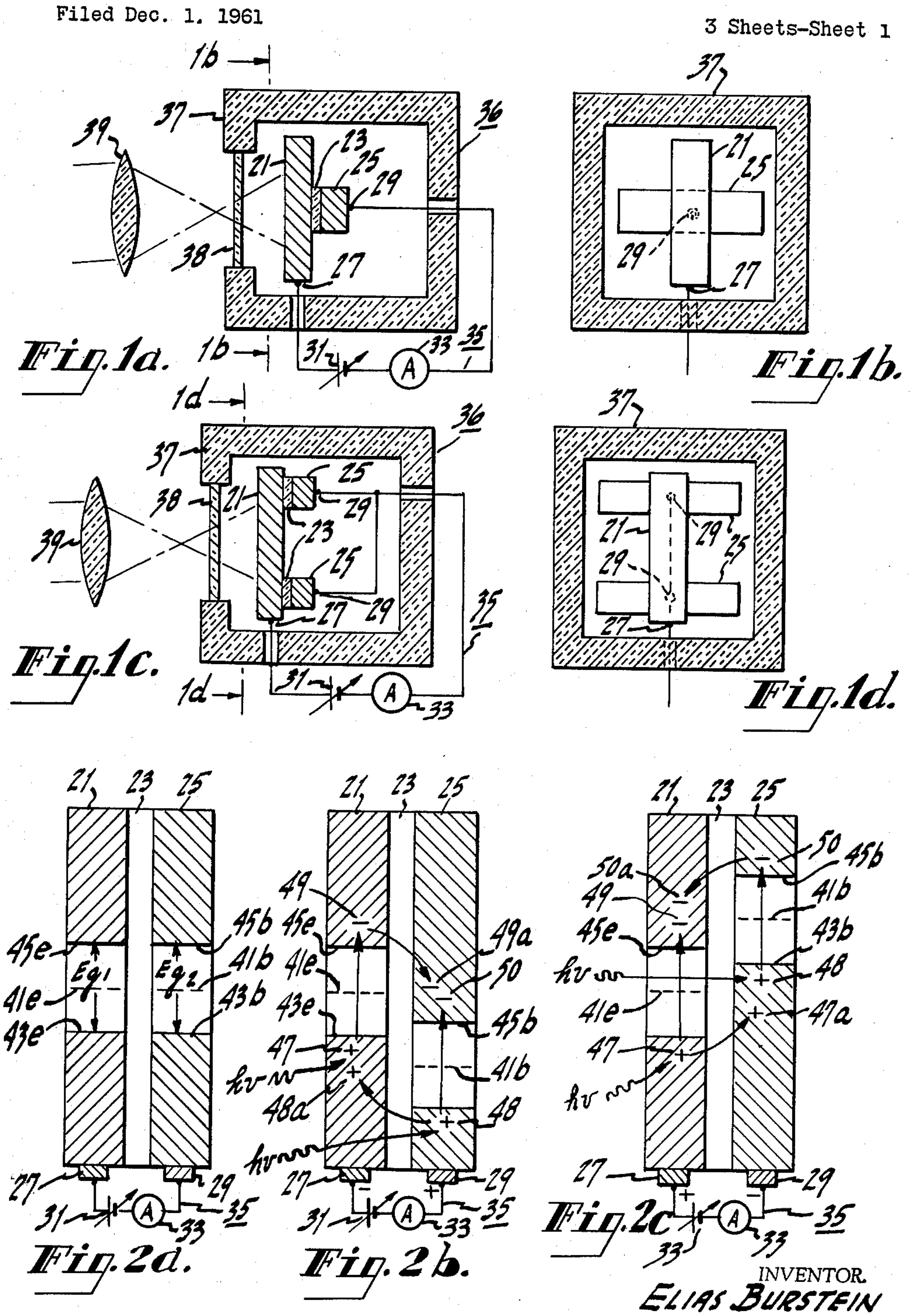

This invention relates to a novel solid state electronic device which operates at temperatures near absolute zero. In particular, the invention relates to a photosensitive device which may be used to detect long wavelength radiation; that is radiation, in the infrared and microwave regions of the spectrum.

Certain materials, referred to herein as superconductors, exhibit two conditions of resistance to the flow of electric current through a body of the material. These conditions are referred to as the normal condition and the superconducting condition. At and above a critical temperature $T_c$, a body of a superconductor is in the normal condition, whereby there is a resistance to the flow of electric current. Below the critical temperature, the body of the superconductor is in the superconducting condition, whereby there is no resistance to the flow of electric current. Bodies of other materials, which are referred to as normal materials, exhibit a normal condition and do not exhibit a superconducting condition.

It is known that a body of a superconductor can be switched from the superconducting condition to the normal condition by applying thereto a sufficiently large magnetic field, or by raising the temperature of the body above its critical temperature $T_c$, or by passing therethrough a sufficiently large electric current equal to or greater than a current called the critical current. It is also known that certain metal-insulator-metal, two-terminal structures at temperatures near absolute zero exhibit a non-linear resistance when one metal is superconducting, and a negative resistance when both metals are superconducting. See, for example, Physical Review Letters, 5, pages 147, 148 and 461 to 466. According to the theory set forth in these references, a superconductor has an energy band gap below a critical temperature $T_c$ near absolute zero. This energy gap corresponds to the energy required to dissociate superconducting electrons, which are paired. The gap increases with decreasing temperature. The energy band below the gap is referred to as the filled band, and the energy band above the gap is referred to as the conduction band. At temperatures near absolute zero, there is a small population of thermally-generated normal charge carriers (electrons in the conduction band and holes in the filled band), which are unpaired carriers. The unpaired normal charge carriers can tunnel through a thin electrical insulator film to another medium whereas paired superconducting carriers do not tunnel through such a film.

It is an object of this invention to provide a novel solid state electronic device which operates at temperatures near absolute zero.

A further object is to provide a photosensitive solid state device which may be used for detecting infrared and microwave radiation.

The device of the invention may be provided in any one of several embodiments. The photo-diode embodiment includes an emitter comprised of a superconductor, means for directing electromagnetic radiation upon the emitter, and means for collecting normal charge carriers from the emitter while, at the same time, blocking the passage of superconducting charge carriers. The collecting means comprises a base, which may be a superconductor, or a degenerate semiconductor, spaced from the emitter by a thin, electrically-insulating layer. By "thin" is meant a thickness such that the normal charge carriers can tunnel through the insulating layer by quantum mechanical tunneling. The thin insulating layer is usually about 6 to 200 A.U. (Angstrom Units) thick, but is preferably 10 to 100 A.U. thick. An emitter connection and a base connection contact the emitter and base respectively.

The photo-diode of the invention is operated at temperatures at which the emitter is superconducting, and preferably at temperatures at which there is a relatively low thermal generation of normal charge carriers in the emitter. In the photo-detector mode of operation, a voltage of suitable magnitude is applied to the connections by means of an external circuit. When electro-magnetic radiation is incident upon the emitter, the energy of the radiation generates normal charge carriers (electrons and holes) in the emitter. Depending on the polarity of the applied voltage, either electrons or holes are collected by the base. A signal is thereby produced which appears as a photo-current in the external circuit and which is a function of the number of quanta absorbed by the body. In the photo-voltaic mode of operation, no bias is applied to the connections. When radiation is incident on the emitter, normal charge carriers are generated and collected as above.

The photo-triode embodiment of the invention comprises a photo-diode as described above and a collector in operative relationship with the base. The base-collector structure is such that the photocurrent is amplified in a mannar analogous to that in a photo-transistor. One photo-triode of the invention comprises a photo-diode as described above, wherein the base is a degenerate semiconductor of one conductivity type. A collector of a non-degenerate semiconductor of the other conductivity type forms a P-N junction with the base. The photo-triode is operated as described above for a photo-diode, except that, in addition, the P-N junction is reverse biased. The photo-current in the diode is amplified in the P-N junction in a manner analogous to that in a photo-transistor.

Figures 4A, 4B, 5A, 5B:
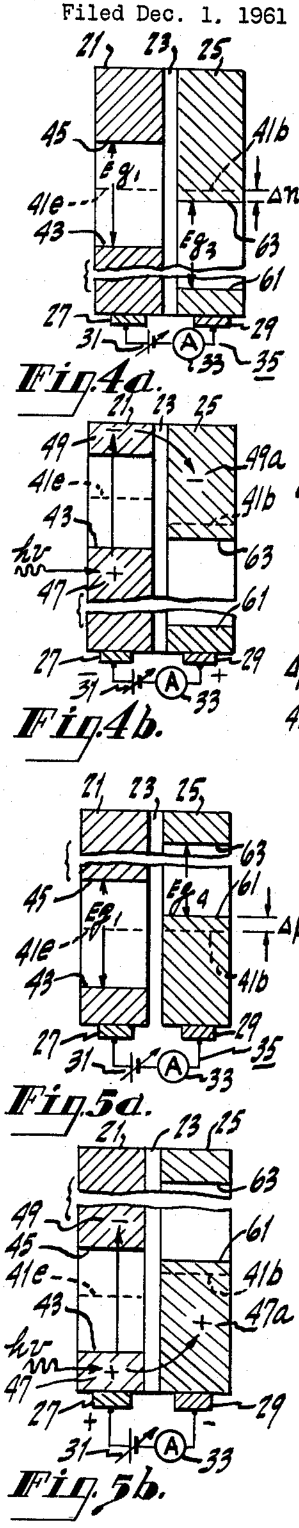
Figures 3A, 3B, 3C, 6A, 6B:
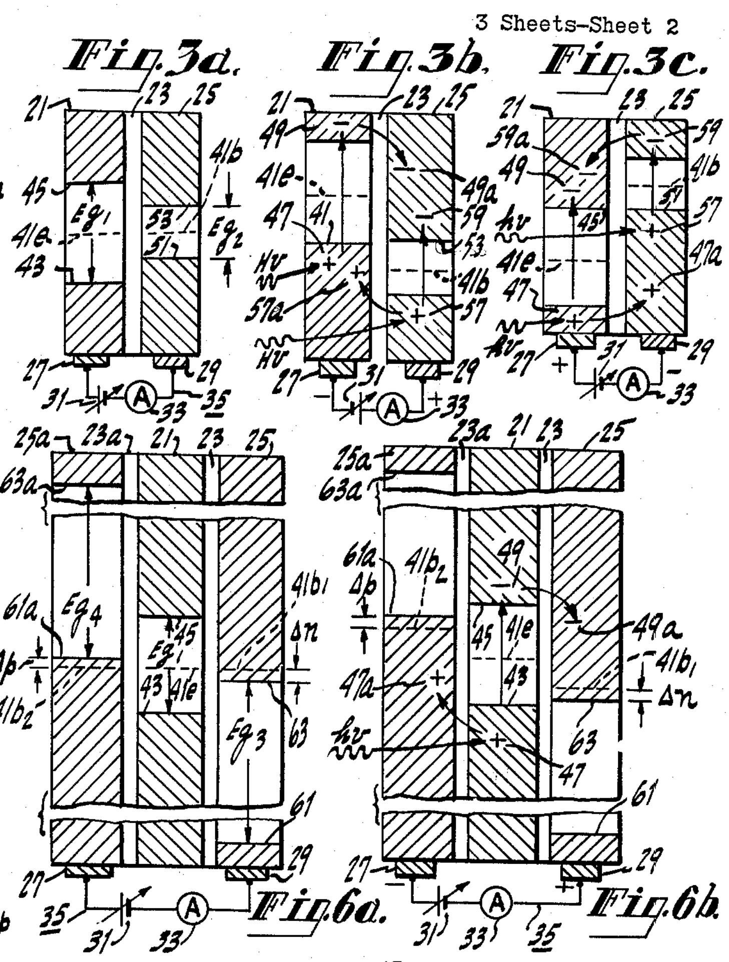
Figure 7:
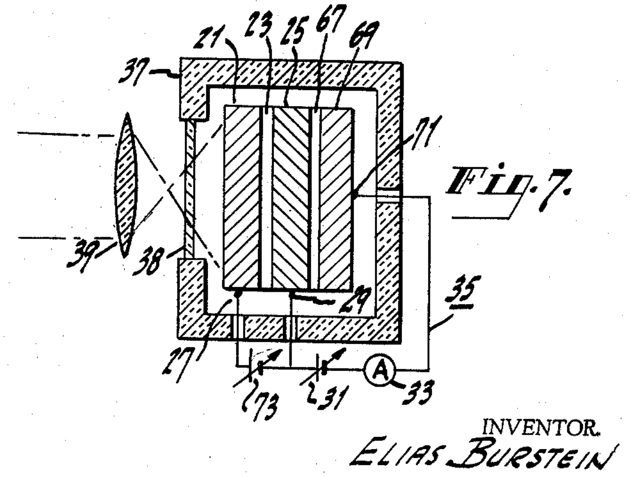
Figure 8A:
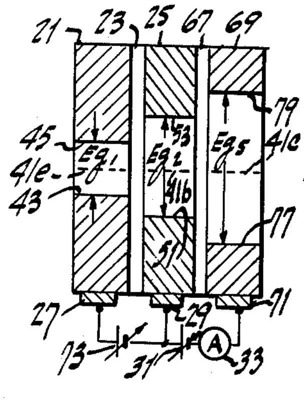
Figure 8B:
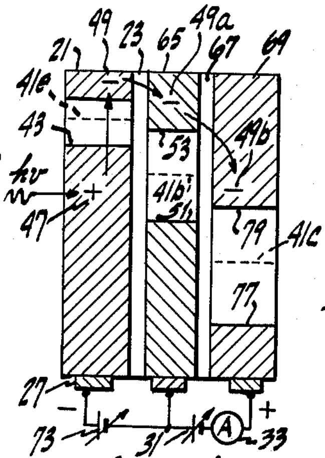
Figure 9:
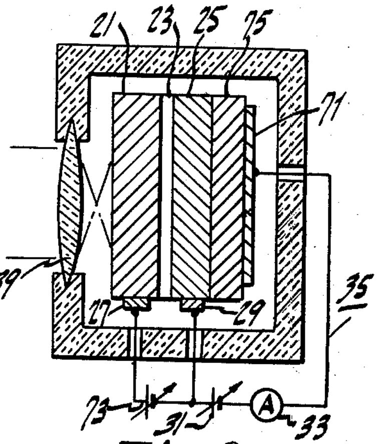
Figure 10A:
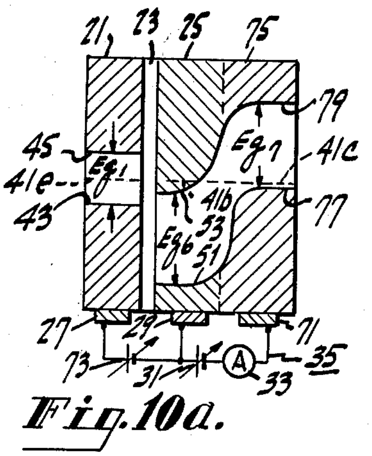
Figure 11A:
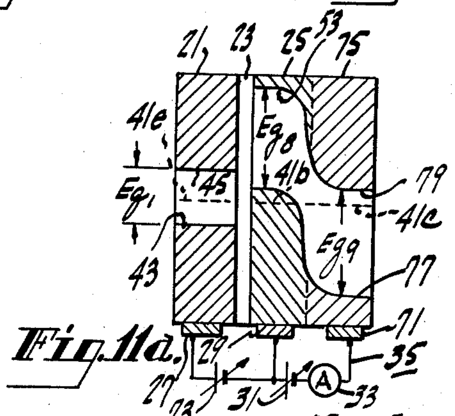
Figure 11B:
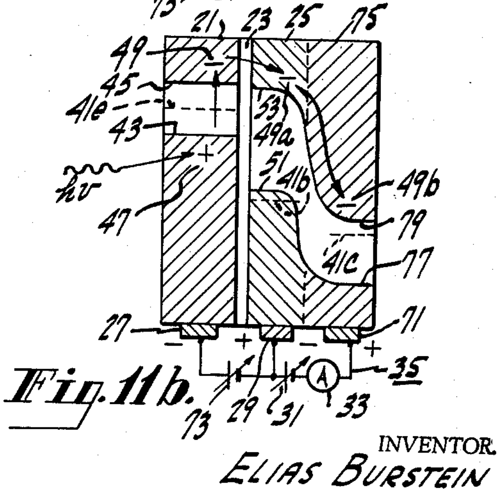
Figure 10B:
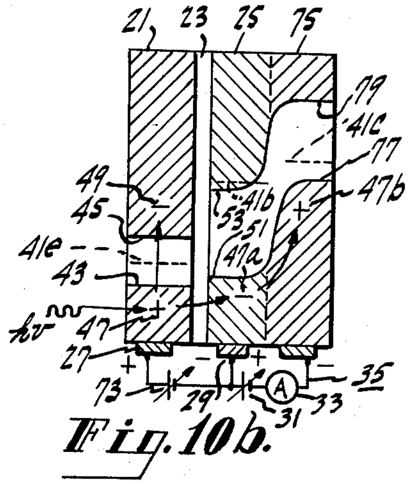

A more detailed description of several embodiments of the invention is set forth below in conjunction with the drawings in which:

FIGURE 1*a* is a partially-schematic, partially-sectional view of a photo-diode of the invention having a longitudinal configuration, FIGURE 1*b* is a sectional view along the section lines 1*b*—1*b* of FIGURE 1*a*, FIGURE 1*c* is a partially-schematic, partially-sectional view of a photo-diode of the invention having a transverse configuration, FIGURE 1*d* is a sectional view along section lines 1*d*—1*d* in FIGURE 1*c*, FIGURES 2*a*, 2*b* and 2*c* are energy diagrams to aid in understanding two different modes of operation of a symmetrical photo-diode of the invention in which the emitter and base are made of the same superconductor material, FIGURES 3*a*, 3*b* and 3*c* are energy diagrams to aid in understanding two different modes of operation of an asymmetrical photo-diode of the invention in which the base is made of a superconductor, different from that of the emitter, FIGURES 4*a* and 4*b* are energy diagrams to aid in understanding the operation of a photo-diode of the invention in which the base is made of a degenerate N-type semiconductor, FIGURES 5*a* and 5*b* are energy diagrams to aid in understanding the operation of a photo-diode of the invention which the base is made of a degenerate P-type semiconductor, FIGURES 6*a* and 6*b* are energy diagrams to aid in understanding the operation of a double photo-diode of the invention which includes two bases wherein one base is made of a degenerate P-type semiconductor and another base is a degenerate N-type semiconductor, FIGURE 7 is a partially-schematic, partially-sectional view of a first photo-triode of the invention including three superconductor regions, emitted, base and collector, spaced from each other by thin insulating layers, FIGURES 8*a* and 8*b* are energy diagrams to aid in understanding the operation of the photo-triode of FIGURE 7, FIGURE 9 is a partially-schematic, partially-sectional view of a second photo-triode of the invention including a superconductor emitter, a degenerate N-type semiconductor base and a P-type semiconductor collector, FIGURES 10*a* and 10*b* are energy diagrams to aid in understanding the operation of the photo-triode of FIGURE 9 and FIGURES 11*a* and 11*b* are energy diagrams to aid in understanding the operation of another photo-triode of the invention which includes a superconductor emitter, a degenerate N-type semiconductor base, and a P-type semiconductor collector.

Similar reference numerals are used for similar structures throughout the drawing.

*Example 1.*—A photo-diode of the invention having a longitudinal configuration is illustrated in FIGURES 1*a* and 1*b*. The photo-diode comprises an emitter 21 of tin metal in the form of a film of uniform thickness about 100 A.U. thick, 0.25 inch wide, and 1.00 inch long. A thin, electrically-insulating layer 23 of tin oxide about 40 A.U. thick contacts one of the surfaces of the emitter 21. A base in the form of a film 25 of tin metal about 100 A.U. thick, 0.25 inch wide, and 1.00 inch long contacts the insulating layer 23. The emitter 21 and base 25 lie across one another, i.e. their lengths are transverse one to the other. An emitter connection 27 and a base connection 29 are in low resistance, non-rectifying contact with the emitter 21 and the base 25 respectively. A voltage source 31 and an electric current meter 33 are connected in series to the emitter connection 27 and the base connection 29 in an output circuit 35. In practice, the device includes also a support for the foregoing structure. The support (not shown in FIGURE 1) is passive to the operation of the device and may be of glass, or ceramic, or plastic. In a typical fabrication process, the base 25 is first produced on the support (not shown) as by vapor deposition of tin metal. The surface of the base is oxidized as by exposure to air to produce a thin insulating layer of tin oxide. Then, the emitter 21 is produced by vapor deposition of tin metal across the layer 21.

In operation, the device is placed in a cryostat 36 or other means for maintaining the device at temperatures substantially below the critical temperature of the superconductor of the emitter 21. In this example, the temperature of the device is maintained at about 2.0° K. The cryostat 36 may comprise for example, an insulating container 37 and a cooling means (not shown), such as a bath of liquid helium, and means for evaporating the liquid helium at low pressure (not shown) adjacent the device. The cryostat 36 is provided with a window 38 to permit radiation to be directed from outside the cryostat 36 upon the emitter 21 inside the cryostat. When the device is at its low operating temperature of 2.0° K. the emitter 21 and the base 25 are in the superconducting condition. There is also provided means such as a lens 39 outside the cryostat for directing or focusing radiation upon that portion of the emitter 21 which is opposite the base 25. The two functions of the window 38 and the lens 39 may be combined by mounting the lens in the walls of the container 37 as illustrated in FIGURE 9.

FIGURE 2*a* illustrates the relationships of energy bands in the device at thermal equilibrium with no bias voltage applied. The Fermi level is shown by the dotted lines in the emitter as 41*e* and in the base as 41*b* and which extends at the same energy level throughout the device. The emitter 21 exhibits an energy bandgap $E_{g1}$ between the top level 43*e* of a filled band and the bottom level 45*e* of a conduction band. The base 25 exhibits an energy bandgap $E_{g2}$ between the top level 43*b* of a filled band and the bottom level 45*b* of a conduction band. In this embodiment, $E_{g1}=E_{g2}$ and therefore the photo-diode is electrically symmetrical. Because the photo-diode is symmetrical the emitter and the base can be interchanged in designation or function.

When the base 25 is biased positively with respect to the emitter 21, the Fermi level 41*b* in the base moves downward with respect to the levels 43*e* and 45*e* in the emitter 21 as shown in FIGURE 2*b*. The base 25 is biased with a voltage less than $E_{g1}$ so that the top level of 43*e* the filled band in the emitter, is just below the bottom level 45*b* of the conduction band in the base. At higher voltages, level 43*e* rises above level 45*b* and there is an excessive leakage current in the output circuit. With the device biased as shown in FIGURE 2*b*, there is a small leakage current which results principally from the collection of normal carriers which are thermally-generated in the emitter 21.

Electromagnetic radiation *hv* is now directed upon the emitter 21 and the base 25 by the lens 39 (FIGURE 1) from the emitter side of the diode. Radiation *hv* absorbed by the emitter 21 generates unpaired or normal holes 47 in the filled band of the emitter 21, and excites unpaired or normal electrons 49 which cross the energy gap $E_{g1}$ to the conduction band. The photo-excited electrons 49 in the emitter now pass through the insulating layer 23 by quantum mechanical tunneling and are collected by the base 25 as shown by the symbol 49*a*, and then pass through the output circuit 35 back to the emitter 21. Radiation *hv* absorbed by the base 25 generates normal holes 48 in the base which pass through the insulating layer 23 by tunneling and are collected by the emitter 21 as shown by symbol 48*a*. Such absorption of radiation thereby produces photocurrents of electrons and holes which are additive and appear in the output circuit 35 where they are detected on the meter 33.

The symmetrical device of Example 1 may also be biased in the opposite polarity as illustrated in FIGURE 2*c*. In this case, the Fermi level 41*b* in the base 25 moves upward with respect to the energy bands 43*e* and 45*e* in the emitter 21. Absorbed radiation *hv* generates normal holes 47 and 48 and normal electrons 49 and 50 in both the emitter and the base as described above. However in this mode of operation, the normal holes 47 and normal electrons 50 tunnel through the insulating layer 23 are collected in the base 25. The current of collected holes is detected on the meter 33 as described above.

There are several possible configurations of the emitter, insulator, and base layers. FIGURES 1*a* and 1b illustrate a longitudinal configuration in which the emitter, insulator and base layers are superimposed upon one another and the radiation is incident upon the photo-diode in the region of superposition. The photo-excited carriers in the emitter pass to the insulator in a direction generally parallel to the direction of the incident radiation. FIGURES 1*c* and 1*d* illustrate a transverse configuration in which the radiation is incident on a portion of the emitter displaced from the region of superposition. The photo-excited carriers in the emitter pass to the insulator in a direction transverse to the direction of the incident radiation. In the transverse configuration, the base may be a thick layer and only the emitter need be thin enough to have adequate absorption. In the longitudinal configuration, the base as well as the emitter is thin.

The absorption of radiation may be optimized by providing suitably shaped reflecting surfaces in the interior of the cryostat 36. Radiation which has not been absorbed will be reflected back to the emitter 21 base 25 or both. The reflecting surfaces may be designed to cause the radiation to make numerous passes through the diode.

The diode may also be operated as a bolometer by providing upon the external surface of the emitter 21 a layer of material, such as carbon black, which absorbs radiation. Radiation absorbed by the layer is converted to heat and passes by conduction to the emitter where normal charge carriers are thermally generated.

The emitter 21 is made of a superconductor. Some suitable superconconductors and their maximum energy bandgaps $E_g$ are listed in the appended table. The energy bandgap $E_g$ determines the long wavelength limit λmax. Thus, for aluminum, λmax.=3.9 mm. corresponding to $$E_g=3.2\times10^{-4}\text{ ev.}$$

and, for lead, λmax.=0.46 mm. corresponding to $$E_g=2.7\times10^{-3}\text{ ev.}$$

The combined width or thickness of the emitter 21 and the base 25 is optimized, taking into consideration the absorption of radiation and the lifetime and diffusion length of the photo-excited carriers. In the longitudinal configuration, the combined width of the emitter 21 and the base 25 should be much smaller than the average wavelengths of the radiation to be detected in order to decrease the reflection of incident radiation and thereby to increase the absorption of the incident radiation by the emitter 21 and base 25. The optimum thicknesses will depend on the materials used. Combined thicknesses between 150 and 500 A.U. are generally satisfactory. In the transverse configuration, only the emitter 21 has a thickness much smaller than the wavelength of the incident radiation.

The insulating layer 23 may be of tin oxide, such as is produced by the oxidation of the tin metal films; or of silicon dioxide deposited from evaporated material, or of an organic material such as barium stearate or chromium stearate deposited by adsorption to the surface of the emitter 21 or the base 25. The insulating layer 23 should be thick enough to block superconducting charge carriers from passage therethrough, but thin enough to allow appreciable tunneling of normal charge carriers therethrough. Generally, these insulating layers are of substantially uniform thicknesses between 6 and 200 A.U. In the case of tin oxide, the insulating layer is preferably 10 to 100 A.U. thick. In the case of barium stearate, the layer is a monomolecular film which is about 40 to 60 A.U. thick.

The base 25 may be made of the same superconductor as the emitter 21, as in Example 1. The base 25 may also be made of a material different from that used for the emitter 21. One such embodiment is illustrated by the energy diagram in FIGURE 3*a*, wherein the emitter 21 and the insulating layer 23 are the same as in the device of FIGURE 2*a*. The base 25 is a superconductor in the superconducting condition and therefore exhibits an energy bandgap $E_{g2}$ between a top level 51 of a filled band and the bottom level 53 of the conduction band.

As illustrated in FIGURE 3*b*, the emitter 21 is biased negatively with respect to the base 25. However, in this mode of operation, the voltage applied is less than $\frac{1}{2}(E_{g1}+E_{g2})$. Normal holes 47 and normal electrons 49 are generated by the absorption of incident radiation $h\nu$, and the normal electrons 49 are collected by the base 25 in a manner similar to that described above with respect to FIGURE 2*b*. If incident radiation is also absorbed in the base 25, normal holes 57 and normal electrons 59 will also be generated in the base 25. Normal holes 57 generated in the base 25 may be collected by the emitter 21 as shown by the symbol 57*a* in such manner as to add to the photo-current detected by the meter 33. The long wave length limit λmax. of the radiation absorbed by the base 25 is determined by the value of the energy bandgap $E_{g2}$ of the base 25. The value $E_{g2}$ may be the same as, greater than, or less than the value of $E_{g1}$.

FIGURE 3*c* illustrates the device of FIGURE 3*a* but biased in the opposite polarity than that described with respect to FIGURE 3*b*. The operation is essentially the same except that, because the energy bands in the emitter are moved downward with respect to the base 25, photo-excited holes 47 in the emitter 21 are collected by the base 25; and photo-excited electrons 59 in the base 25 are collected by the emitter 21 as indicated at 59*a*.

The base 25 may also be made of a degenerate semiconductor, such as germanium, silicon, or indium antimonide. One such embodiment is illustrated by the energy diagram of FIGURE 4*a*, wherein the emitter 21 and the insulating layer 23 have the same structure as in the device of FIGURE 2*a*. The base 25 is N-type and exhibits an energy band gap $E_{g3}$ between a top level 61 of the filled band and a bottom level 63 of the conduction band. The Fermi level 41*b* in the base 25 lies in the conduction band an energy $\Delta n$ above the bottom level 63 of the conduction band because the semiconductor is degenerate. The diagram of FIGURE 4*a* is broken to indicate that the gap $E_{g3}$ in the base 25 is much larger than the gap $E_{g1}$ in the emitter 21. As illustrated in FIGURE 4*b*, the emitter 21 is biased negatively with respect to the base 25 for operation as a photo-detector. In this mode of operation, the applied voltage is less than $\frac{1}{2}E_{g1}-\Delta n$, where $\Delta n$ is the separation between the Fermi level and the bottom level 63 of the conduction band in the semiconductor. Normal holes 47 and normal electrons 49 are generated in the emitter 21 by absorption of incident radiation thereon, and the electrons are collected by the base 25 as previously described. This photodiode can also be operated with zero bias as a photovoltaic cell. The electrons 49 generated in the superconducting emitter 21 tunnel through the insulating layer 23, into the conduction band of the base 25. This yields a photo-current under short circuit operation and a photovoltage under open circuit operation.

FIGURE 5*a* illustrates a photo-diode similar to that of FIGURE 4*a* except that the base 25 is of a degenerate P-type semiconductor. The operation of the device of FIGURE 5*a* is similar to that of FIGURE 4*a* except that the polarity of the applied voltage is reversed as shown in FIGURE 5*b*. The energy bands in the base 25 move upward with respect to the energy bands in the emitter 21 when the voltage is applied, and normal holes are collected from the emitter 21 by the base 25.

The photo-diode of FIGURES 4*a* and 5*a* can be operated as a photo-voltaic cell with zero applied bias voltage. The photo-current in a short circuit configuration and the photo-voltage in an open circuit configuration will be due to the tunneling of holes 47 from the filled band of the superconducting emitter through the insulating layer into the filled band of the semiconductor.

FIGURE 6*a* illustrates a double photo-diode embodiment of the invention. The photo-diode of FIGURE 6*a* comprises an emitter 21 of a superconductor having two opposed surfaces. A first base 25 of a degenerate N-type semiconductor is spaced from one of said surfaces by a first thin electrically-insulating layer 23. A second base 25*a* of degenerate P-type semiconductor is spaced from the other of said surfaces by a second electrically-insulating layer 23*a*. Optionally, either or both of the bases 25 and 25*a* may be composed of a superconductor. Connections 27 and 29 are made to the first base 24 and the second base 25*a* respectively. A voltage is applied so that the energy bands in the first base 25 move downward and the energy bands in the second base 25*a* move upward no more than half the value of $E_{g1}$ plus Δ, the separation in energy between the Fermi level $41b_1$ and the bottom 63 of the conduction band in the base 25, or between the Fermi level $41b_2$ and the top 61*a* of the filled band of the base 25*a*. Incident radiation $h\nu$ absorbed in the emitter 21 generates normal holes 47 and normal electrons 49. The normal electrons 49 are collected from the emitter by the first base 25 as shown by the symbol 49*a*. The normal holes 47 are collected by the second base 25*a* from the emitter 21 as shown by the symbol 47*a*. In the embodiment of FIGURE 6*a*, incident radiation may be absorbed also in either or both of the first base 25 and the second base 25*a* and may produce an additional photo-current.

The double photo-diode illustrated in FIGURE 6*a* can also be operated at zero applied voltage as a double photovoltaic cell on either an open circuit or a short circuit configuration. Electrons 49 and holes 47 generated in the emitter, tunnel to the degenerate N-type semiconductor and to the degenerate P-type semiconductor and yield either a photo-current in short circuit configuration or a photo-voltage in open circuit configuration.

The double photo-diode may be provided in either the longitudinal or the transverse configuration. In the longitudinal configuration, the two bases 25 and 25*a* are in opposed positions on the emitter 21. In the transverse configuration, the two bases 25 and 25*a* are offset from one another on the same or on opposite sides of the emitter 21.

The invention includes also photo-triodes. These may be photo-diodes as described above, in which a collector is operatively associated with the base. The photo-current is amplified by the base-collector structure in a manner analogous to that of a photo-transistor.

FIGURE 7 illustrates a photo-triode embodying the invention. An emitter 21 of a superconductor, a first electrically-insulating layer 23 and a base 25 of a superconductor comprise a photo-diode which is similar in structure to the photo-diode of FIGURE 1*a*. A second electrically-insulating layer 67, similar in structure to the first electrically-insulating layer 23, contacts the base 25. A collector 69 of a superconductor similar in structure to the base 25 contacts the second electrically-insulating layer 67. An emitter connection 27 contacts the emitter 21, a base connection 29 contacts the base 25, and a collector connection 71 contacts the collector 69. The connections 27, 29 and 71 make low resistance, non-rectifying contact to the emitter 21, the base 23 and the collector 29 respectively. The emitter may be of aluminum metal, the base of tin metal and the collector of lead metal. The combined metal layers may be about 200 A.U. thick. The insulating layers may be the corresponding oxides of the metals, or of silicon monoxide deposited by evaporation, or of an organic material, barium or chromium stearate deposited by evaporation to the surface of the emitter and to the base layers. The insulating layers may be about 40 A.U. thick. In operation, the emitter 21 of the photo-triode is biased either positively or negatively with respect to the base 23 by means of a first voltage source 73 and the collector 69 is biased in the opposite polarity as the emitter 21 and with respect to the base 25 by means of a second voltage source 31. A load circuit 35 comprising the second voltage source 31 and a current measuring meter 33 are connected in series between the base connection 29 and the collector connection 71.

FIGURE 8*a* is an energy diagram of the device of FIGURE 7 at thermal equilibrium with no bias voltage applied. The emitter 21, the base 23 and the collector 69 each exhibit an energy band gap $E_{g1}$, $E_{g2}$ and $E_{g5}$ respectively; and each exhibits a Fermi level 41*e*, 41*b*, and 41*c* respectively. In FIGURE 8*a*, the energy band gaps are shown to be progressively larger from emitter to collector, which is the preferred relationship. However, the energy band gaps may be selected in other size and relationship. For example, the emitter and the base may be of the same superconductor, such as tin metal or aluminum metal and the collector may be of a second superconductor having a larger energy gap, such as lead metal.

FIGURE 8*b* is an energy diagram illustrating one mode of operation of the device of FIGURE 7. The emitter 21 is biased negatively so that the top level 43 of the filled band in the emitter 21 is slightly below the bottom level 53 of the conduction band in the base 25. The collector 69 is biased positively so that the bottom level 79 of the conductor band in the collector 69 is slightly above the top level 51 of the filled band in the base 25. The emitter bias voltage is slightly smaller than $\frac{1}{2}(E_{g1}+E_{g2})$ and the collector bias is slightly smaller than $\frac{1}{2}(E_{g2}+E_{g5})$.

Incident radiation $h\nu$ absorbed in the emitter 21 generates free holes 47 in the filled band and excites free electrons 49 in the conduction band of the emitter 21, as in the photo-diode. The free electrons then tunnel through the first insulating layer 23 to the base 25 as shown by 49*a* and then tunnel through the second insulating layer 67 to the collector 69 as shown by 49*b*. The current in this latter tunneling step is detected as a photo-current on the meter 33. The impedances of the emitter-to-base and of the base-to-collector tunneling steps are adjusted to give an amplification of the photo-current.

In another mode of operation, the device of FIGURE 7 may be operated by the collection of holes 47 from the emitter 21 simply by reversing the polarity of the emitter 21 and the collector 69 with respect to the base 25.

FIGURE 9 illustrates another embodiment of a photo-triode. An emitter 21 of a superconductor, an electrically-insulating layer 23, and a base 25 of a degenerate N-type semiconductor comprises a photo-diode which is similar in structure to the photo-diode of FIGURE 4*a*. A collector 75 of a non-degenerate P-type semiconductor forms a P-N junction with the base 25. An emitter connection 27 contacts the emitter 21, a base connection 29 contacts the base 25, and a collector connection 71 contacts the collector 75. The connections 27, 29 and 71 make low resistance, non-rectifying contact to the emitter 21, base 25 and collector 75 respectively. The emitter 21 may be of lead metal approximately 250 A.U. thick, and the P-N junction may be of germanium with the degenerate N-layer containing about $10^{18}$ donors per cm.$^3$ about 1 mil thick on a P-type body containing about $10^{16}$ acceptors per cm.$^3$ about 1 mm. thick. The insulating layer may be a metal oxide such as lead oxide, or evaporated silicon monoxide, or chemically deposited barium stearate.

The emitter 21 of the photo-triode of FIGURE 9 is biased with respect to the base 25 by means of a first voltage source 73 connected between the emitter and base connections 27 and 29. A load circuit 35 comprising a second voltage source 31 and a current measuring meter 33 are connected in series to the base connection 29 and the collector connection 71.

FIGURE 10*a* is an energy diagram of the device of FIGURE 9 at thermal equilibrium with no voltage applied. The emitter 21, the base 25 and the collector 75 each exhibit an energy band gap $E_{g1}$, $E_{g6}$ and $E_{g7}$ respectively; and each has a Fermi level 41*e*, 41*b* and 41*c* respectively. FIGURE 10*b* is an energy diagram illustrating one mode of operation of the device of FIGURE 10*a*. The emitter 21 is positively biased with respect to the base 25 so that the bottom level 45 of the conduction band in the emitter 21 is slightly above the top level of the filled band in the base 25. The collector 75 is negatively biased with respect to the base 25, so that the energy bands in the collector 75 move upwardly with respect to the energy bands in the base 25.

Incident radiation $h\nu$ absorbed by the emitter 21 generates normal holes 47 and normal electrons 49 as previously described. The normal holes 47 tunnel through the insulating layer 23 to the base 25 as indicated by the symbol 47*a*, and then pass to the collector 75 as indicated by the symbol 47*b*. The current of this latter collection step is detected by the meter 33. The impedance of the P-N junction is higher than the impedance between the emitter 21 and the base 25 and thereby provides an amplification of the photo-current.

FIGURE 11*a* is an energy diagram illustrating another embodiment of a photo-triode which is similar in structure to the photo-triode of FIGURE 9. An emitter 21 of a superconductor, an electrically insulating layer 23 and a base 25 of a degenerate P-type semiconductor comprises a photo-diode which is similar in structure to the photo-diode of FIGURE 5*a*. A collector 75 of a non-degenerate N-type semiconductor contacts the base 25 and the contact area defines a P-N junction. An emitter connection 27 contacts the emitter 21, a base connection 29 contacts the base 25, and a collector connection 71 contacts the collector 75. The connections 27, 29 and 71 make low resistance, non-rectifying contact to the emitter 21, base 25, and collector 75 respectively. The emitter 21 of the photo-triode is biased with respect to the base by means of a first voltage source 73 connected between the emitter and base connections 27 and 29. A load circuit 35 comprising a second voltage source 31 and a current measuring meter 33 are connected in series to the base connection 29 and the collector connection 71. FIGURE 11*a* is an energy diagram of the embodiment at thermal equilibrium with no voltage applied. The emitter 21, the base 25 and the collector 75 each exhibit an energy band gap $E_{g1}$, $E_{g8}$ and $E_{g9}$ respectively; and a Fermi level 41*e*, 41*b* and 41*c* respectively. The emitter superconductor may be made of lead metal about 50 A.U. thick. The insulating layer may be lead oxide or evaporated silicon monoxide or chemically deposited barium stearate about 40 A.U. thick. The P-N junction may be germanium with the degenerate P-layer containing about $10^{18}$ acceptors per cm.$^3$, about 1 mil thick upon an N-type body containing about $10^{16}$ donors per cm.$^3$, about 1 mm. thick.

FIGURE 11*b* is an energy diagram illustrating one mode of operation of the device of FIGURES 9 and 10*a*. The emitter 21 is biased negatively with respect to the base 25 so that the top level 43 of the filled energy band in the emitter 21 is slightly below the bottom level 53 of the conduction band in the base 25. The collector 75 is positively biased with respect to the base 25 so that the energy bands in the collector 75 move downwardly with respect to the energy bands in the base 25.

Incident radiation *hv* absorbed in the emitter 21 generates normal holes 47 and normal electrons 49, as previously described. The normal holes tunnel through the insulating layer 23 to the base 25 as indicated by the symbol 49*a* and then pass to the collector 75 as indicated by the symbol 49*b* in *FIGURE* 11*b*. The current of this latter collection step is detected by the meter 33. An amplification of the photo-current is achieved when the impedance of the P-N junction is higher than the impedance between the emitter 21 and the base 25.

*Table*

| Superconductor | $T_c$, ° K. | $E_g$[1] (millivolts) |
|---|---|---|
| Technetium (Tc) | 11.2 | 3.4 |
| Niobium (Nb) | 8.7 | 2.6 |
| Lead (Pb) | 7.2 | 2.7 |
| Lanthanum (La) | 5.4 | 1.6 |
| Vanadium (V) | 4.9 | 1.5 |
| Tantalum (Ta) | 4.4 | 1.3 |
| Mercury (Hg) | 4.2 | 1.3 |
| Tin (Sn) | 3.7 | 1.1 |
| Indium (In) | 3.4 | 1.1 |
| Thallium (Tl) | 2.4 | 0.7 |
| Rhenium (Re) | 1.7 | 0.5 |
| Thorium (Th) | 1.4 | 0.4 |
| Aluminum (Al) | 1.2 | 0.3 |
| Gallium (Ga) | 1.1 | 0.3 |
| Zinc (Zn) | 0.9 | 0.3 |
| Uranium (U) | 0.8 | 0.2 |
| Osmium (Os) | 0.7 | 0.2 |
| Zirconium (Zr) | 0.6 | 0.2 |
| Cadmium (Cd) | 0.6 | 0.2 |
| Ruthenium (Ru) | 0.5 | 0.1 |
| Titanium (Ti) | 0.4 | 0.1 |
| Hafnium (Hf) | 0.4 | 0.1 |

[1] (Energy gap at T=0° K. measured by tunneling in Pb, Sn, In, and Al. For other metals, it is assumed to be 3.5 $kT_c$, where $k$=0.086 millivolts/degree=Boltzmann's constant.)

What is claimed is:

1. An electronic device comprising an emitter composed of a superconductor, a thin electrically-insulating layer contacting said emitter, a base composed of a degenerate semiconductor of one conductivity type contacting said layer, a collector composed of a semiconductor of the other conductivity type forming a P-N junction with said base, a first electrode contacting said emitter, a second electrode contacting said base, a third electrode contacting said collector, and means for directing electromagnetic radiation upon said emitter.

2. An electronic device comprising an emitter composed of a superconductor, a thin electrically-insulating layer contacting said emitter, a base composed of a degenerate semiconductor of one conductivity type contacting said layer, a collector composed of a semiconductor of the other conductivity type forming a P-N junction with said base, a first electrode contacting said emitter, a second electrode contacting said base, a third electrode contacting said collector, means for directing electromagnetic radiation upon said emitter, and means for maintaining the temperature of said emitter below its critical temperature.

3. An electronic device comprising a body including an emitter region composed of a superconductor adjacent a surface of said body, an electrically-insulating layer about 6 to 200 A.U. thick contacting said body, a base composed of a degenerate semiconductor of N-type conductivity contacting said layer, a collector region composed of a semiconductor of P-type conductivity forming a P-N junction with said base, a first electrode contacting said body, a second electrode contacting said base, a third electrode contacting said collector, and means for directing long wavelength electromagnetic radiation upon said emitter region.

4. An electronic device comprising a body including an emitter region composed of a superconductor adjacent a surface of said body, an electrically insulating layer about 6 to 200 A.U. thick contacting said body, a base composed of a degenerate semiconductor of P-type conductivity contacting said layer, a collector composed of a semiconductor of N-type conductivity forming a P-N junction with said base, a first electrode contacting said body, a second electrode contacting said base, a third electrode contacting said collector, and means for directing long wavelength electromagnetic radiation upon said emitter region.

5. An electronic device comprising a body including an emitteer region composed of a superconductor adjacent a surface of said body, a first thin electrically-insulating layer contacting said emitter region, a base of a superconductor contacting said body, a second thin electrically-insulating layer contacting said base, a collector contacting said second layer, a first electrode contacting said body, a second electrode contacting said base, a third electrode contacting said collector, and means for directing long wavelength electromagnetic radiation upon said emitter region.

6. An electronic device including an emitter composed of a superconductor, means for directing long wavelength electromagnetic radiation incident upon said emitter, means for collecting normal electrons from said body, and separate means for collecting normal holes from said body, each of said collecting means comprising a separate base composed of a material selected from the group consisting of superconductors and degenerate semiconductors spaced from said emitter region by a thin electrically-insulating layer about 6 to 200 A.U. thick, and means for maintaining the temperature of said emitter below its critical temperature.

References Cited by the Examiner

UNITED STATES PATENTS 2,189,122 2/40 Andrews ____________ 307—88.5

(Other references on following page)

UNITED STATES PATENTS

| | | | |
|---|---|---|---|
| 2,742,550 | 4/56 | Jenness | 250—211 X |
| 2,791,761 | 5/57 | Morton | 250—211 X |
| 2,920,205 | 1/60 | Choyke | 250—83.3 |
| 2,967,961 | 1/61 | Heil | 250—83.3 |
| 3,025,416 | 3/62 | Johnson | 307—88.5 |
| 3,070,698 | 12/62 | Bloemberger | 250—83.3 |
| 3,076,949 | 2/63 | Anderson | 250—211 X |
| 3,077,538 | 2/63 | Franzen | 250—83.3 |
| 3,096,431 | 7/63 | Schmidlin | 307—88.5 |

OTHER REFERENCES

Electronics Newsletter, "Tunneling Observed in Supercooled Thinfilms," Electronics, Nov. 25 ,1960, page 11.

Pankove: "Optical Absorption by Degenerate Germanium," Physical Review Letters, May 1, 1960, pp. 454–455.

Sklar: "The Tunnel Diode—Its Action and Properties," Electronics, Nov. 6, 1959, pp. 54–57.

RALPH G. NILSON, *Primary Examiner.*

ARCHIE R. BORCHELT, *Examiner.*